US006613677B1

(12) United States Patent
Herbots et al.

(10) Patent No.: US 6,613,677 B1
(45) Date of Patent: Sep. 2, 2003

(54) LONG RANGE ORDERED SEMICONDUCTOR INTERFACE PHASE AND OXIDES

(75) Inventors: Nicole Herbots, Tempe, AZ (US); Vasudeva P. Atluri, Scottsdale, AZ (US); James D. Bradley, Gilbert, AZ (US); Banerjee Swati, Chandler, AZ (US); Quinton B. Hurst, Tempe, AZ (US); Jiong Xiang, Tempe, AZ (US)

(73) Assignee: Arizona Board of Regents, Phoenix, AZ (US)

( * ) Notice: Subject to any disclaimer, the term of this patent is extended or adjusted under 35 U.S.C. 154(b) by 0 days.

(21) Appl. No.: 09/555,251
(22) PCT Filed: Nov. 25, 1998
(86) PCT No.: PCT/US98/25355
§ 371 (c)(1),
(2), (4) Date: Oct. 19, 2000
(87) PCT Pub. No.: WO99/28953
PCT Pub. Date: Jun. 10, 1999

Related U.S. Application Data
(60) Provisional application No. 60/067,297, filed on Nov. 28, 1997.

(51) Int. Cl.[7] .................. H01L 21/311; H01L 21/31
(52) U.S. Cl. .................. 438/694; 438/697; 438/770; 438/958; 257/629
(58) Field of Search .................. 438/694, 697, 438/770, 958; 257/629

(56) References Cited

U.S. PATENT DOCUMENTS 5,350,492 A * 9/1994 Hall et al. .................. 156/657

OTHER PUBLICATIONS

Wolf et al ,Silicon Processing for the VLSI Era, pp. 516–517.*

* cited by examiner

Primary Examiner—Alexander Ghyka
(74) Attorney, Agent, or Firm—Gallagher & Kennedy, P.A.; Thomas D. MacBlain

(57) ABSTRACT

A semiconductor processing method capable of producing highly ordered, ultra thin dielectrics, including gate oxide and other semiconductor dielectrics, and interphase phases with low defect density. The process includes a degrease step, an etch, primary oxidation and then a passivation step which utilizes hydrofluoric acid to passivate the cleaned silicon surface with hydrogen. Dielectric layers may then be formed with low interface defect density, low flat band voltages and low fixed charge on semiconductor substrates.

109 Claims, 6 Drawing Sheets

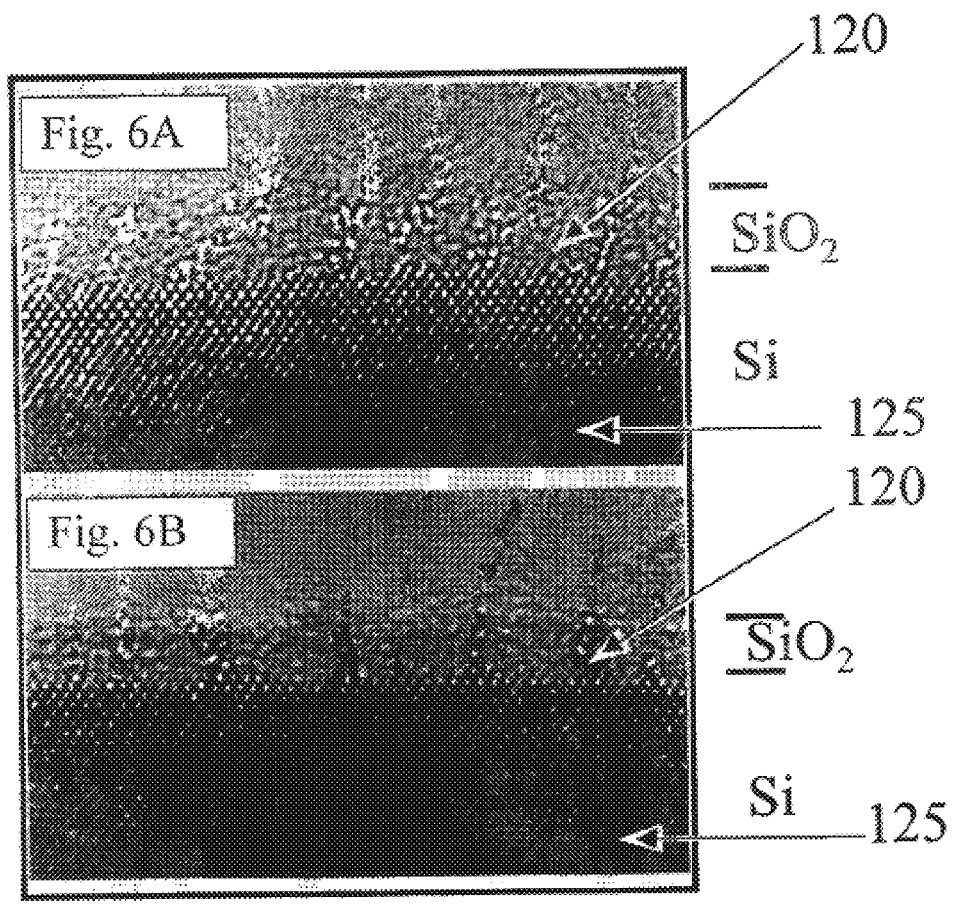

US 6,613,677 B1

LONG RANGE ORDERED SEMICONDUCTOR INTERFACE PHASE AND OXIDES

The present application claims priority rights based on U.S. Provisional Application Ser. No. 60/067,297, filed Nov. 28, 1997.

FIELD OF THE INVENTION

This invention relates to oxides grown on the surface of a substrate, more specifically to epitaxial oxides grown on the surface of semiconductors, and to the interface formed between the oxide and the semiconductor.

BACKGROUND OF THE INVENTION

Ever since the first integrated circuit was demonstrated, one goal of the electronics industry has been to increase the density of individual devices in an integrated circuit. The smaller the device, the faster the conduction across the device. Ultimately, as smaller devices are made, the devices can be packed more densely, which reduces transmission between devices and also allows for faster operation.

Metal oxide semiconductor (MOS) technology forms the basis for a large part of chip manufacturing. In typical MOS transistor technology, $SiO_2$ is grown so as to form part of a metal oxide semiconductor gate. $SiO_2$ SO formed is commonly referred to as a gate oxide or a gate oxide dielectric. Until the time of this invention, $SiO_2$ grown on MOS transistor gates has always been thought of as amorphous with little ordering in the first atomic layers at the interface between the silicon substrate and the oxide layer.

When the semiconductor material is not silicon, i.e., it is one of the multi-element semiconductors (e.g. $Si_xGe_{1-x}$ or GaAs) or germanium, the growth of an oxide layer is problematic. For instance, a multi-element semiconductor containing Si, when exposed to oxidation, tends to form a silicon oxide material at the surface, but below the silicon oxide layer the other material becomes more prevalent at the interface since the silicon there is depleted by its reaction with oxygen to form the oxide. This creates defects and changes the electrical characteristics of the interface.

Silicon has deficiencies as a semiconductor material when compared to some multi-element semiconductor material. However, silicon is used commercially as a semiconductor preferentially over other materials because it readily forms stable oxide dielectric layers with a lower interface defect density than other semiconductors and their oxides. The stability of $Si/SiO_2$ having a low interface defect density enables the manufacture of transistors with better electrical properties than is attainable with other semiconductors.

The desire for lower dimension devices presents a basic problem: as devices get smaller in three dimensions, the dielectric layer must get both narrower and thinner and continue to function as a dielectric. Silicon does not always provide the optimum physical and electronic properties, such as a low interface defect density or a high dielectric constant, necessary to or tailored to fill a particular need. A desire for materials that have better tailored physical and electronic properties creates another problem: growth of dielectric layers on multi-element semiconductors is difficult. These two problems become essentially insurmountable when one desires a small device made out of a semiconductor other than doped silicon. Conceptually, a solution would lie in producing either a well-ordered ultra-thin oxide on top of the multi-element semiconductor, or at least a more ordered interface between the semiconductor and the dielectric layers. Doing so without elemental or phase separation is extremely difficult especially in chemical systems where the defect generation rate is higher than silicon, and as the physical sizes involved approach atomic dimensions. Any improvement in ordering at the interface or in the material will improve the interface defect density. It will be appreciated that, as smaller devices demand thinner dielectric layers, interface characteristics become increasingly important.

Another goal of electronic device processing is the growth of heterodielectrics or other materials listed below on a semiconductor substrate. While this goal is achievable for some systems, in general, growth of ordered films of a material on a semiconductor substrate is difficult.

FIG. 1A shows a diagram depicting a gate structure, a common configuration of components in a semiconductor device, in conjunction with an energy diagram 190. This diagram illustrates the relative energies for several critical parameters: the conduction band ($E_c$), the intrinsic Fermi level ($E_{F,i}$), the Fermi level ($E_f$) and the valence band ($E_c$). In this figure $SiO_2$ (171) is exhibiting an ideal interface with silicon. The defect-free interface does not capture electrons in the conduction path 175 of the p-type semiconductor 177. The energy diagram 190 clearly shows that the bands are flat for ideal $SiO_2$.

FIG. 1B also depicts the arrangement as described in FIG. 1A. In this case, $SiO_2$ 179 has defects. These defects cause the bands to bend as seen in 192, for example electrons 181 (represented as minus signs) along the $SiO_2/Si$ interface can be captured by these defects, thus decreasing conduction in the n-channel 177.

In FIG. 1C, a voltage is applied to the gate structure 183. Though the $SiO_2/Si$ interface 185 has defects, the applied voltage, $V_{gate}$, attracts electrons at the $SiO_2/Si$ interface 185, and fills the defects (also called electron traps) at the interface. Therefore, extra conduction electrons can then flow unhindered, furthermore the bands now appear flat.

Disordered interface layers in the interfacial region, as discussed above, bring forth several effects. Disorder increases the interface defect density which causes a change in the electronic structure of the bands at the interface; the bands bend. The bands in the material form from the overlap of each constituent atom's atomic orbitals. In a defect-free, non-molecular three dimensional solid, continuous bands can extend across the entire solid. In this case, a conduction band would provide a continuous path across the material. See FIG. 1A.

Any defect, such as a dislocation or a point, line, or planar defect, in the solid or at an interface, breaks the continuous nature of the bands because the energy of electronic orbitals of atoms on one side of the defect no longer align with the energy of orbitals of atoms on the other. This difference in alignment in the relative energies of the orbitals results in different energy levels for the overlapping orbitals. The energy levels of the continuous bands are defined by the degree of local overlap between the atomic orbitals. When the defect is an elemental impurity, the situation is more complicated. Explained simplistically, the orbitals of the impurity atom occupy different energy levels which cause the electrons to occupy energy levels outside of the bands. Because of the manner in which the atomic levels combine to form bands, the local perturbation in energy levels for dislocations and impurity defects or any type of point, line or planar defects, as described above, results in a local perturbation of the energy levels inside or outside of the bands. Extra, discreet energy levels appear which can result in band bending. See FIG. 1B. Band bending, because it provides additional energy levels in the conduction or the valence bands, can trap conduction electrons or holes. Electrical carriers are referred to as trapped because, in addition to the electrical force generated by the applied potential that causes conduction, an additional potential must also be applied to dislodge these trapped electrons and cause them to move.

To an extent, the interface between the dielectric layer on the surface of a semiconductor and the semiconductor itself acts like a defect. While it provides a discontinuity in the conduction band itself, the interface, if not ideal or perfect, causes the conduction band in the semiconductor material to be perturbed and therefore, produces band bending. Defects in the dielectric near the interface can also perturb the bands in the semiconductor. Band bending at the interface interferes with the flow of conduction electrons in the region of the semiconductor material immediately below the interface. As devices made from semiconductors become smaller, the interference with conduction caused by band bending becomes more important as described below.

To enable the defect containing material to function as a semiconductor, the trapping caused by band bending must be overcome regardless of whether the defect is due to dislocations, impurities, or any point, line, or planar defects or due to a layer of dielectric on the surface and the interface it forms. To a large extent in semiconductor materials, this is accomplished by producing very pure, highly crystalline materials and ultraclean, impurity-free interfaces. However, those methods do not deal with band bending caused by the intrinsic defect density of the interface between the dielectric and semiconductor material. Currently, this interface band bending is overcome by applying a voltage known as the flat band voltage. This voltage realigns the bands back to a flat condition, exactly compensating for band perturbations caused by any types of defects in the interfacial region. When the semiconductor material is part of a transistor, the flat-band voltage must be applied in addition to any control voltage used to operate the transistor. See FIG. 1C. Therefore, a device with a poorer electronic structure at the interface has a larger necessary bias voltage and higher power consumption. The need for the application of a larger bias voltage in addition to the control voltage increases the net voltage applied to the dielectric film. However, the thinner the film, the lower the voltage it can sustain. Thus, smaller transistor dimensions require minimizing or decreasing this voltage so as not to exceed the breakdown voltage of the thin oxide. Furthermore, a higher defect density at the interface results in more locations to pin conduction electrons, thereby decreasing the rate at which electrons can cross the device. The ideal interface structure has a low interface defect density, a low flat-band voltage, and a low fixed charge. A better, though heretofore unachieved, solution to band bending caused by the interfacial region is to grow an interface that has a structure commensurate with that of the semiconductor. The more the interfacial region looks like the semiconductor, from the point of view of the atomic levels on the semiconductor atoms, the less band bending. Creating a gradual change in the nature of the structure in the interfacial region causes less severe band bending. Another way to achieve this is to create an interface that has decreased interface defect density as compared to a conventional oxide. In other words, the growth of a more commensurate oxide or the formation of a more commensurate interface region, independent of the bulk oxide phase, results in an improvement of the interface defect density and of the ensuing electronic properties such as the flat band voltage, etc.

To minimize the interface defect density, considerable attention has been given to the surface treatment of the crystalline semiconductor wafers from which chips are formed. A typical RCA clean consists of degreasing the surface of the wafer in an oxidizing, basic solution such as 4–5:1:1 $H_2O$: $H_2O_2$: $NH_4OH$ followed by an ionic clean/etch with a HF solution. The use of this cleaning step is an attempt at improving the quality of the interface by removing first organic impurities, and then metallic impurities.

As the art of electronics is currently practiced, the use of smaller dimensions for devices in silicon and especially the use of smaller devices for multi-element semiconductor materials is severely hampered by the quality of dielectric layers that can be formed. Also, the growth of heterodielectics on semiconductor substrates is also very difficult. What is needed is a method for growing more ordered layers of dielectrics and other material on the surfaces of semiconductors such as Si, $Si_xGe_{1-x}$, GaAs, $Si_{1-x-y}Ge_xC_y$, $Si_{3(1-x)}Ge_{3x}N_{4(1-\delta)}$, Ge, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$, and GaAlAs. Another need is a method that will allow the growth of heterodielectrics and other materials such as $CaF_2$, $BaF_2$, $SrTiO_3$, $Pb(Zr,Ti)O_3$, $BaTiO_3$, $Zr(Ca)O_2$, $Zr(Y)O_2$, $LiNbO_3$, $(LiNbO_3$, $SrTiO_3)$, $(Zr—Ca)O_2$, $Zr(Y)O_2)$, GaAs, $Ga_2O_3$, $As_2O_5$, CdTe, InP, ZnSe, ZnS, HgCdTe, GaSb, InSb, Yttrium Barium Copper Oxide, Lanthanum Strontium Copper Oxide and Barium Europium Copper Oxide on the surface of a semiconductor substrate while substantially segregating the substrate from the overlayer.

SUMMARY OF THE INVENTION

In accordance with the invention, a method of producing ultra-thin films of a dielectric material on the surface of a substrate comprises the steps of creating a clean, atomically smooth (thus planar) surface on the substrate while simultaneously lowering the chemical reactivity of the surface so that any surface layer that forms naturally or is caused to form does so in a more ordered fashion than in conventional oxides producing a higher quality interface between the substrate surface and the growing layer. One embodiment comprises the steps of degreasing the surface of the substrate, then etching any native oxide off of the surface of the substrate, reoxidizing the surface of the substrate, and etching while passivating the surface of the substrate. Optionally, a final oxidation step can be employed. The invention consists of creating an interface surface phase with low defect density, and optionally an oxide layer on top of it, either conventionally grown or ordered.

The invention also includes an interface phase and/or a dielectric material produced using the above-mentioned method, a semiconductor device having a dielectric produced using the above-mentioned method, and the dielectric composition of matter so-produced.

In one embodiment of the process, according to the invention, the substrate is prepared (either mechanically or chemically) to be very smooth on the atomic level (one surface atomic step per 100–200 Å linear distance, compared to one atomic step per 10–20 Å as is common in the art), while simultaneously removing the native oxide coating that exists on virtually all substrates (element or alloy-like), removing most organic and metallic impurities, and then coating the surface of the substrate with an ultra-thin oxide-based dielectric or other surface coating which greatly retards the regrowth of the native oxide or other oxygen containing surface species. The resulting slow film growth and the extremely flat substrate surface combine synergistically to create an interface phase with an overlaid dielectric film comparable or better in dielectric quality to the very best dielectric films prepared commercially, but also much thinner and capable of being grown on most main group semiconductor substrates.

The dielectric layer thus-formed may be as thin as one half to ten nm. The process may include a preliminary degreasing step. An etching step may provide the smoothness and oxide and impurity removal. A primary oxidation step and a passivation step may provide the ultra-thin oxide-based coating or interface phase. Optionally, a final oxidation step may be employed. One of the main prerequisites in achieving an ultra-thin film dielectric is beginning with a substrate surface that is predominately smooth on the atomic level. Once the surface of the substrate is properly smoothed and passivated, then almost any well-known oxidation method will produce a high quality dielectric layer on top of the interface phase because the preparation and passivation steps promote slow growth of the oxide layer in well-known oxidation processes. In fact, if the surface is properly smoothed and cleaned, the passivation step itself will result in an interface phase suitable for use in microelectronic devices. The steps, called pre-passivation steps, of degreasing, etching, and primary oxidation create an atomically smooth, clean surface or a surface whose smoothness is improved as compared to conventional processes. This yields an interface phase with a lower interface defect density.

When it is desired to form thicker dielectric layers, the final oxidation step is employed. The prior surface preparation is still necessary even when a thicker layer is needed because the surface preparation seems to be the key factor in forming an interface phase that is more ordered and has a lower interface defect density as compared to conventional oxides. By making the surface smooth, the surface preparation forms an appropriate foundation for an interface that has a low interface defect density with some degree of higher order than conventional oxides. This interface phase then can seed the growth of a suitable oxide layer of increased thickness.

In the case of a silicon containing substrate, when a final oxidation step is not used, the surface prepared in accordance with the invention comprises an interface phase containing at least silicon, oxygen and hydrogen in an undetermined stoichiometry. When a final oxidation step is used, the surface is substantially $SiO_2$. The final oxidation step results in an interface phase buried underneath an overlayer of $SiO_2$. However, the interface phase between the $SiO_2$ layer and the substrate is still believed to comprise silicon, oxygen and hydrogen. Because the atomic structures of silicon-containing substrates and $SiO_2$ are dissimilar, the structure of the interface layer must bridge between that of the silicon-containing substrate and that of $SiO_2$ by being substantially compatible with the structure of the silicon substrate on one side and $SiO_2$ on the other. In making the transition between silicon and $SiO_2$, there will invariably be instances of empty oxygen and silicon valence bonds. By the processes of this invention, it is believed that a hydrogen component serves to fill empty silicon or oxygen valence bonds at the interface. Furthermore, both infrared spectroscopy and ion beam analysis indicate the presence of silicon, oxygen and hydrogen at the interface. The actual bonding configuration of this interface phase has an infrared spectroscopic signature that does not include silicon hydride absorptions.

Dielectric films of between one or two atomic layers to 20 nanometers have been grown on a substrate, specifically, the surface of Si(100). The thinnest films are grown at room temperature by exposure to ambient air after passivation (i.e. simple exposure to oxygen gas), or in the passivation solution itself, or in a furnace at high temperature with low oxygen flow and a high nitrogen flow, or at temperatures below the oxidation temperature for silicon below 850° C. Passivation slows the rate of oxide formation, so that a higher quality interface phase forms. All well known commercial oxidation processes can function as the final oxidation step in the practice of this invention including rapid thermal oxidation, furnace oxidation, high pressure oxidation and room temperature oxidation.

In connection with this invention, certain terms are used that are believed to be understood by those skilled in the art. "Long range ordering" is an expression that means, in contradistinction to "short range ordering," a regularity in the location of the atoms in a structure, such as a crystalline structure such that the location of an atom can be accurately predicted three, four, or more positions distant from a known atom location.

"Ultra-thin," as used herein, means having a thickness of 40 Å or less.

"Interface defect density" is an expression used to mean a density of surface defects such atomic steps, missing atoms, or the presences of unfilled bonds. "Low" interface density is interface density lower than that achieved in prior procedures, all other variables being equal.

By "low flat-band voltage" is meant a flat-band voltage lower than that experienced in devices prepared using conventional semiconductor wafer cleaning and preparation, all other variables being equal.

"High capacitance" means a capacitance achieved that is higher than that achieved by dielectrics using conventional semiconductor wafer cleaning and preparation, all other variables being equal.

The above and further advantages of this invention will be better understood with reference to the following detailed description of the preferred embodiments taken in combination with the attached drawings.

BRIEF DESCRIPTION OF THE DRAWINGS

FIG. 6A is a diagrammatic illustration of an electron micrograph showing unordered prior art semiconductor/dielectric interface.

FIG. 6B is a diagrammatic illustration of an electron micrograph showing the ordered semiconductor/dielectric interface of the present invention.

DETAILED DESCRIPTION

The Substrate

As used herein, the term "semiconductor" means any material that is not intrinsically a good conductor and that has a small enough band gap that it could conceivably be doped to function as a semiconductor (i.e. a band gap that is less than approximately 10 eV) and that is chemically and otherwise compatible with the process of the invention.

Semiconductor substrates that should be suitable for use in the invention include all group IV element and IV, IV—IV, and IV—IV—IV multi-element substances, e.g. Si, Ge, $Si_xGe_{1-x}$, $Si_{1-x-y}Ge_xC_y$, $Ge_xC_{1-x}$, etc. When Ge is the substrate, the solubility of the oxide may preclude use of the standard method disclosed below, but the broad process of creating a very smooth surface along with passivating the Ge surface will produce an ultra-thin dielectric film. III–V semiconductors, e.g. GaAs, AlN, etc., are also expected to be useful as substrate materials because of their high mobility and the ease of modulating their band gap. Nitride containing semiconductors such as $Si_3N_4$ or $Si_{3(1-x)}Ge_{3x}N_{4(1-\delta)}$ will function as substrates as well. Dielectrics on silicon and other group IV, IV—IV, and IV—IV—IV materials such as nitrides and oxynitrides can benefit from this method. These materials are both stable with respect to the solutions employed and can form a passivating hydrogen-based layer when exposed to a hydrogen source. They are also capable of being etched by hydrofluoric acid (HF). II–VI semiconductors (ZnS or ZnSe) also benefit from very flat surface preparation and slow dielectric growth on the surface.

Surface Preparation

Figure 1A:
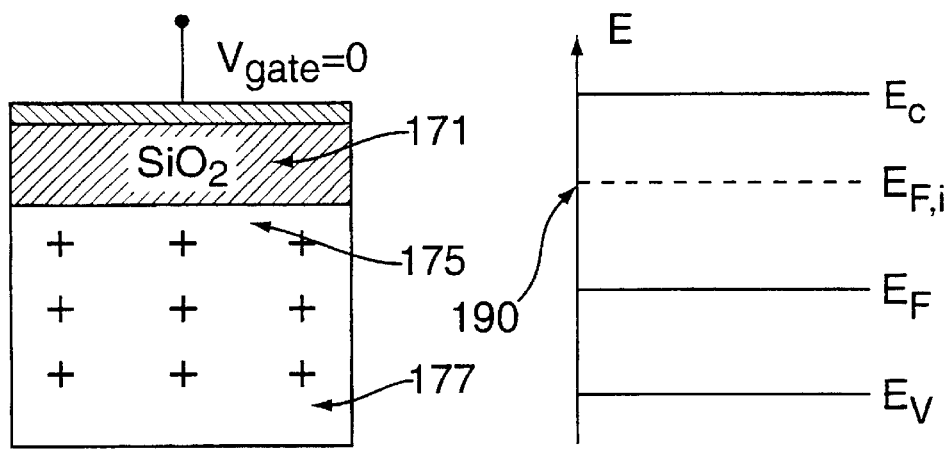
FIG. 1A is a diagrammatic illustration of charge location and band structure of ideal $SiO_2$ deposited on a p-type semiconductor
Figure 1B:
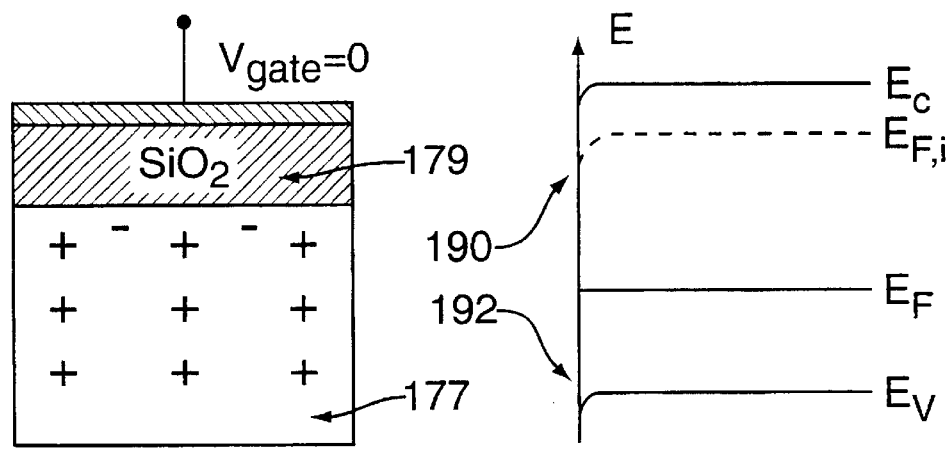
FIG. 1B is a diagrammatic illustration of charge location and perturbed band structure of defects containing $SiO_2$ deposited on a p-type semiconductor.
Figure 1C:
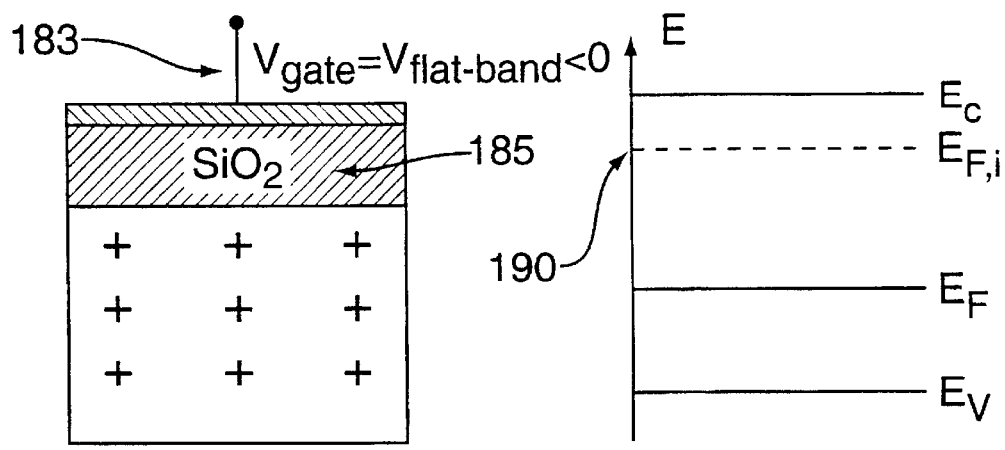
FIG. 1C is a diagrammatic illustration of charge location and a flat-band voltage compensated band structure of defect containing $SiO_2$ deposited on a p-type semiconductor.
Figure 2:
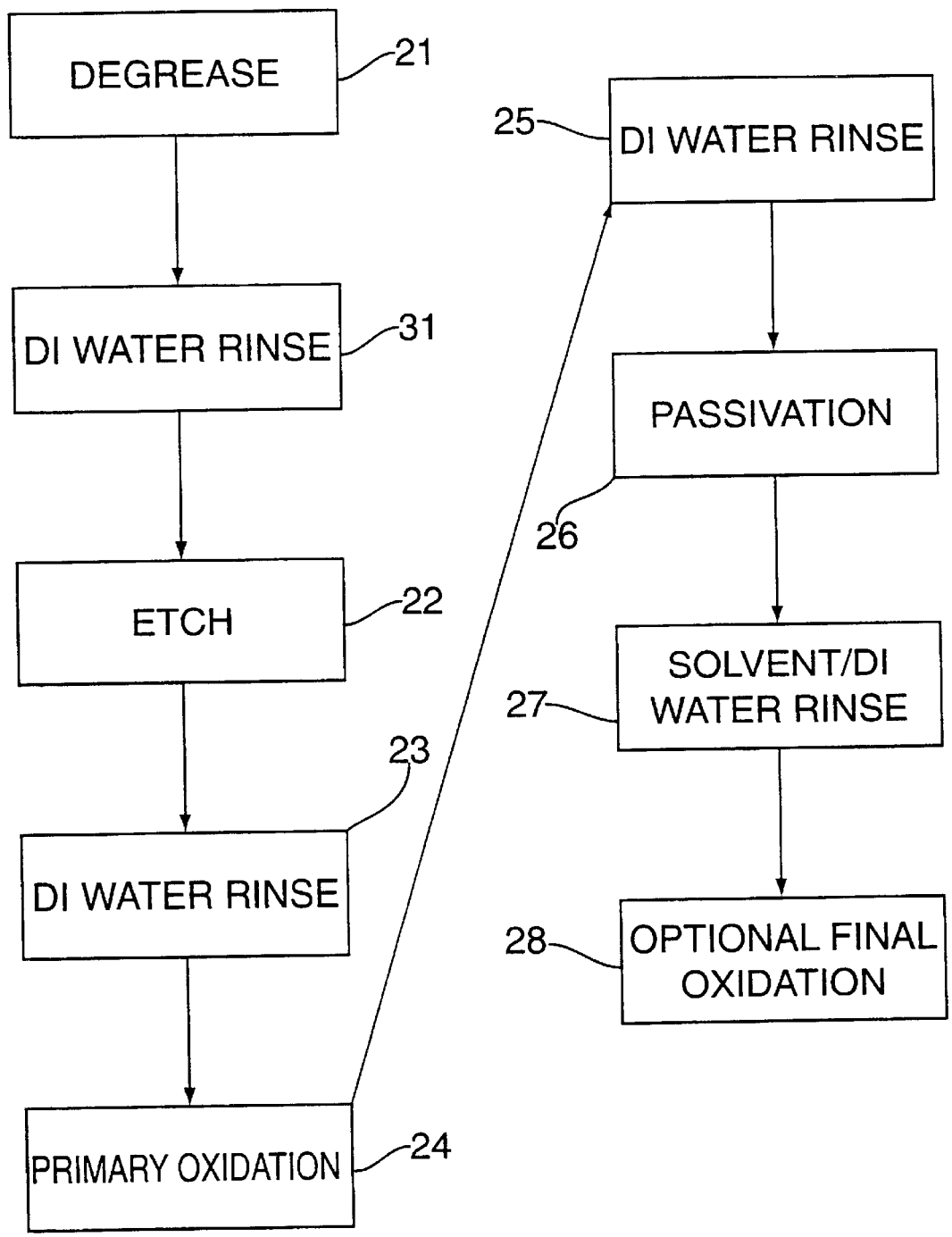
FIG. 2 is a diagrammatic illustration of a flow chart of steps in the process of forming dielectric layers in accordance with the present invention.

The steps in the process of the invention are illustrated in FIG. 2. Generally, all rinse steps may employ water or another solvent, as specified, that can be deoxygenated or agitated by purging or bubbling with $N_2$.

The first step 21 in the process is the degreasing step. This step cleans loose contaminants from the surface of the substrate. It also completely removes any organic impurities on the surface of the substrate, hence the term degreasing. The composition of the degreasing solution is oxidizing and strongly basic. A preferred degreasing solution contains 4 parts $H_2O$ to 1 part 25–35% $H_2O_2$ solution and 1 part conc. $NH_4OH$ solution measured by volume. However, a variety of degreasing solutions will suffice. The oxidizing agent and base should be of high purity and lack metallic components. In successful experiments, the source of $H_2O$ in the degreasing solution was high purity DI $H_2O$ of 18.3 megohm resistivity. The $H_2O_2$ and $NH_4OH$ solutions were of part per billion grade purity and certified as Class 10 clean room suitable. The invention was practiced with the degreasing solution held at 80° C. The substrate was retained in the degreasing solution for approximately 10 minutes. The substrate was then rinsed in the DI $H_2O$ as indicated at 31 in FIG. 2 for approximately 5 minutes. The DI $H_2O$ used in the rinse steps 31, 23, and 25 had been deoxygenated by purging with $N_2$ gas.

As indicated at 22 in FIG. 2, the next step is etching. This step is also known as an ionic clean because it removes ionized impurities imbedded in the native oxide or located on the surface. It acts as a cleaning step because it removes all oxide from the surface of the substrate and takes the surface down to the elemental (or multi-element) non-oxidized substrate by dissolving or etching away the surface oxide layer. Any solution capable of dissolving the surface oxide and solvating the ionic impurities would be suitable for use in the etching step 22. After etching, the substrate is again washed 23 with the deionized water of 18.3 megohm resistivity.

A solution successfully used for etching has been a mixture of 98 parts water to 2 parts of 49% hydrofluoric acid solution measured by volume. The substrate was kept in the etching solution until such time that, when removed from the solution, it was not wetted by water. In other words, when all of the oxide layer has been removed, water will not adhere to the surface of the substrate (i.e., the surface has become hydrophobic). This typically takes approximately 1 to 2 minutes in the exemplary etching solution described. The required time of immersion in the etching solution depends upon the identity and concentration of the etching solution.

The next step 24 is reoxidation which has herein been designated the "primary" oxidation step. This step oxidizes the surface of the substrate. It also serves to further reduce ionic impurities. Any impurity left on the surface of the substrate is trapped in the oxide layer that regrows during this step. Any solution capable of oxidizing the surface of the substrate with an appropriate choice of treatment time and solution temperature is suitable for use in this invention.

In the actual practice of this invention, a solution of 4 parts $H_2O$ to 1 part 25–35% $H_2O_2$ solution to 1 part conc. HCl solution was employed. The reagents were of part per billion grade purity and certified for use in a class 10 clean room. The solutions were held at 80 degrees C. in a temperature controlled water bath. The substrate was immersed in this oxidation solution for approximately 10 minutes.

The goal of this step is to reoxidize the etched surface. Therefore, the time and temperature of the actual practice of the invention is not considered critical. It is believed that the practice of the invention would be equally effective if the oxidizing solution were prepared in any of a wide range of concentrations, heated to any of a wide range of temperatures and likewise for varying amounts of time, as long as a fresh oxide layer was grown on the surface of the substrate. The oxide could be grown by any thermal method of oxidation, such as thermal furnace oxidation. This step is also followed by a rinse in deionized water, as described above and shown in 25.

Step 26 is the passivation step. In one embodiment of the invention, it is the final step in preparing the interface phase or the final dielectric on the surface of the substrate. In another embodiment of the invention, the passivation step is followed by a second oxidation, herein designated the "final" oxidation step.

The passivation step 26 removes the newly grown oxide layer and fills any dangling or empty chemical valence bonds of the substrate surface with hydrogen, oxygen, or a mixture comprising oxygen and hydrogen bonded to Si. The layer grown in this step can retard the rate of further oxide formation on the surface of the substrate. However, Si—O bond formation is not prevented and may take place in the passivation solution. Ultimately, the goal is not to prevent oxide formation at this step, but to grow an ordered or a partially ordered interface phase or a dielectric (even if it happens to not contain oxygen at all) with a low interface defect density. The interface phase or the dielectric that forms upon removal from, and perhaps in, the passivation solution is such a layer. This layer can be also be called a passivation layer. Furthermore, the surface of the substrate, once processed using the above steps, provides a foundation that enables growth of thicker oxide layers through additional oxidation steps while preserving a low interface defect density and a degree of order at the interface.

Any polar solvent capable of being easily removed and capable of forming a solution with a suitable etchant will function in this step. The solvent used in the passivation solution can be water, a non-alcoholic solvent or an alcoholic solvent provided that it is capable of forming a solution with the etchant. In a preferred embodiment, the passivation solution is prepared from an alcohol and 49% HF solution or $H_2O$ and 49% HF solution. Any simple alcohol with a low enough volatility so that it can be easily removed and that can form a solution with the etchant, will function as the alcohol portion of the passivation solution. For example, methanol, ethanol, 1-propanol, 2-propanol, 1-butanol, and 2-butanol are all expected to function in this invention. The treatment time for passivation should be chosen to be long enough to completely remove the oxide layer formed in the prior oxidation step. In practice, that time ranges from about ½ to 5 minutes. The temperature of the passivation solution can be varied. Note that higher temperatures could cause a loss of alcohol and hydrofluoric acid as gases. In the actual practice of this invention, the passivation solution was used at room temperature. Following the passivation step, the substrate is rinsed 27 in deionized water or the solvent of the passivation step or another suitable solvent.

Optionally, after the passivation step 26 and rinse 27, a final oxidation step 28 can be employed. All known oxidation processes are expected to satisfactorily perform this final oxidation step. Oxidation methods typically used in the semiconductor processing industry would be particularly useful for the growth of thicker oxide films. These include rapid thermal oxidation, furnace oxidation, high pressure oxidation, and room temperature oxidation.

In actual, successful practice of the process, because metal impurities and contaminants can decrease the yield in semiconductor chip manufacturing, non-metal containing reagents were used. Nevertheless, it is expected that the invention could be practiced with metal containing oxidizing agents, bases, or neutral agents.

The processes described will function under a wide range of purities of reagents, temperatures of solutions, and times of treatment and rinses. The degreasing treatment time only has to be long enough to thoroughly remove any organic surface contaminants. The degreasing solution can be at any temperature at which the solvent remains liquid. Lower purity reagents would cause a lower yield in any subsequent chip manufacturing, but would not detract from the bulk quality of the thin film as a whole. While lower purity reagents could potentially cause local quality problems in the film, it is likely that they could be used if steps were taken to thoroughly rinse the substrate. At minimum, lower purity reagents can be used any time the desired end product could tolerate a higher level of impurities in the film. On the other hand, increasing purity decreases interface defect density and thus improves interface quality.

In accordance with one aspect of the invention, there is employed a technique for measuring oxygen, carbon and hydrogen coverage of the substrate with a precision better than 0.1 monolayers by ion beam analysis (IBA) using a unique combination of conditions to obtain greatly enhanced sensitivity. During IBA, ion channeling is combined with oxygen nuclear resonance at 3.05 MeV ($^{16}O(\alpha,\alpha)^{16}O$) in order to improve the signal-to-noise ratio by a factor of up to 300. In addition, a direct measurement of crystal order becomes possible for the first time by comparing the total amount of oxygen measured from rotating random spectra with the net amount of disordered oxygen measured by channeling. Using this methodology, significant ordering over macroscopic areas of thin film oxides has been observed. Direct Electric Recoil Detection is used to measure hydrogen coverage.

Figure 3A:
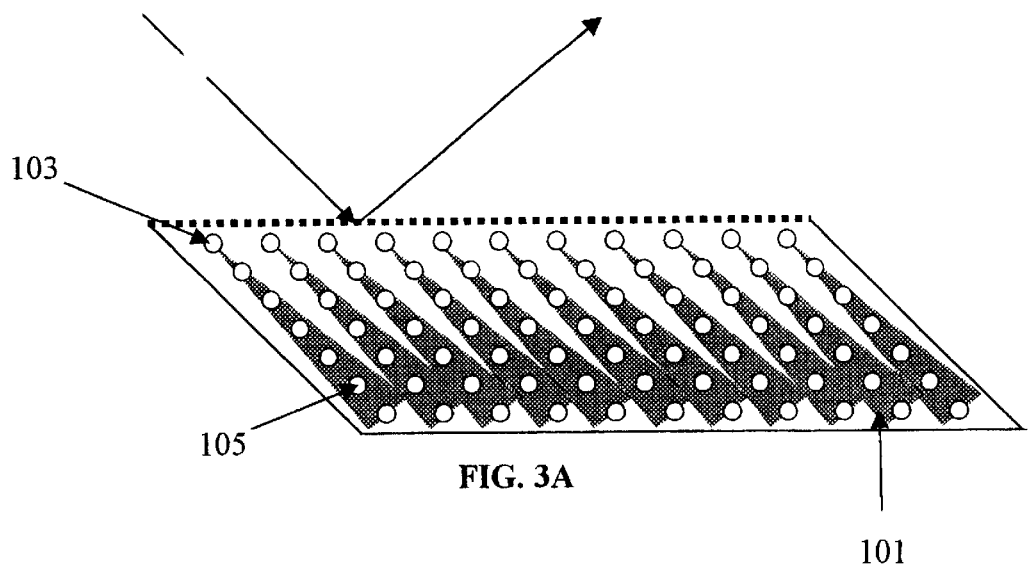
FIG. 3A is a diagrammatic illustration of a shadowing process in ion beam analysis.

A channeling measurement is done by directing an ion beam along a specific direction or vector at the surface of the substrate. The oxygen atoms in the oxide surface layer shadow underlying oxygen atoms when the proper direction or vector is chosen. In a perfectly ordered oxide, the measurement will detect surface oxygen and part of the shadowed oxygen atoms located in the region immediately adjacent to the surface. The shadow of the oxygen surface atoms is called a shadow cone. The amount that oxygen atoms further down from the surface contribute to the measured oxygen depends on their depth. The deeper the oxygen atom is the less it contributes to the detected signal, until a depth is reached where the oxygen atoms no longer contribute at all. This depth-related decrease occurs, in part, because oxygen atoms deeper inside the solid are within the shadow cone of oxygen atoms closer to the surface, and the cross-section of that shadow cone increases with depth, thus providing a wider shadow. In FIG. 3A, the gray region 101 represents the shadow of a surface atom 103, as described above. Any portion of an atom within the shadow does not contribute to the signal measured during channeling. Atoms 105 are within the shadow 101, for example, and will not be observed. In addition to oxygen atoms located near the surface, disordered oxygen is detected as well. When the ion beam is directed along a particular vector, an atom that is crystallographically below an oxygen atom at the surface will not be detected because it is shadowed. Atoms 107 displaced from crystallographic positions are denoted by stripes. They are either unshadowed or not shadowed as completely as crystallographically positioned atoms 105. While the channeling measurement measures ordered surface atoms plus a portion of the disordered bulk, here the use of the term "disordered atoms" with respect to IBA encompasses the value measured in the channeling measurement including disordered bulk atoms and ordered surface atoms. Comparing the channeled oxygen to the total oxygen measured by rotating the sample around the channeling vector yields a value proportional to the amount of disordered oxygen. This ratio can be compared to other oxides if both oxides have the same structure and the channeling vector is the same. The lower the ratio of channeled oxygen to total oxygen in this measurements, the higher the average order of the oxygen atoms in the structure.

Figure 3B:
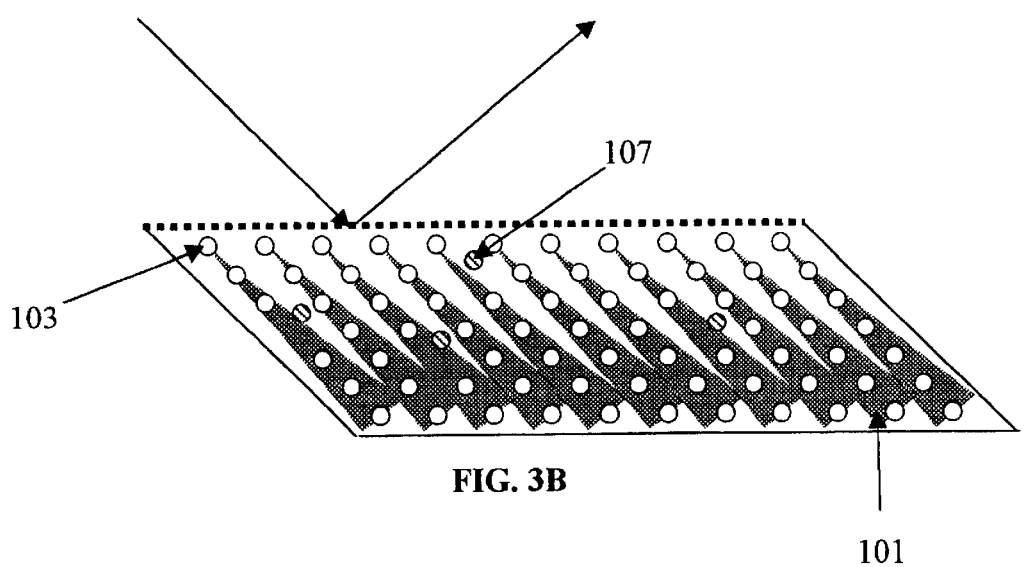
FIG. 3B is a diagrammatic illustration of channeling yield enhancement due to minimal surface damage and the resultant disorder created therefrom from bombardment of ions during ion beam analysis. This same view can represent a partially disordered surface before bombardment.
Figure 3C:
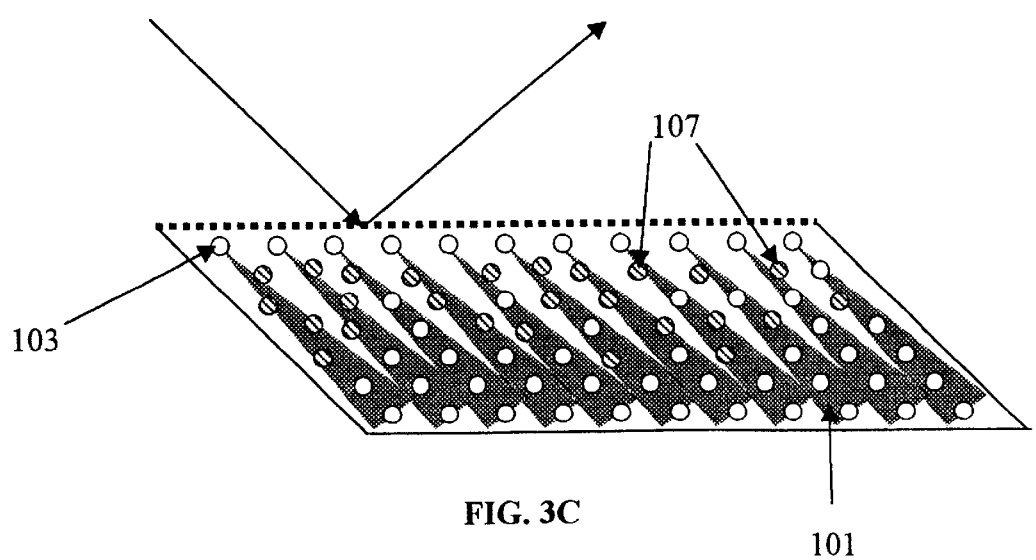
FIG. 3C is a diagrammatic illustration of channeling yield enhancement due to extensive surface damage from bombardment of ions during ion beam analysis. This view also represents a highly disordered surface before bombardment.

Oxygen atoms become displaced from their initial location during the measurement when a particles ($^4He^{2+}$) impinge on the film because of the low atomic number ratio of oxygen to $^4He^{2+}$ (4:1) as compared to the atomic number ratio of Si to $^4He^{2+}$ (7:1). A comparison between FIG. 3A and FIG. 3B shows more atoms outside of the shadowed region after some bombardment. Eventually, after enough bombardment, the ordering is greatly diminished. See FIG. 3C. Accompanying the decrease in ordering is an increase in the number of atoms outside of the shadowed region and therefore an increase in the channeling yield. Oxygen and silicon yields were measured, not only for one fixed $^4He^{2+}$ dose used for analysis, but also as a function of successive doses, ranging from 10 to 50 times the dose necessary to accumulate enough statistics for one measurement. The measured oxygen yield versus $^4He^{2+}$ dose is called a damage curve. See FIG. 4.

Structural damage resulting in atomic displacements can be observed in a channeling direction as the channeling yield gradually increases with $^4He^{2+}$ dose. However, the random yield is not affected. The random yield measured via rotating random spectra depends on whether oxygen is deposited or sputtered away during analysis. However, a steady, or in most cases, slightly decreasing random yield has always been found for oxygen in the damage curves to date, while the channeling yield in cases where the oxide is very thin increases. The thinner the interface phase formed, oxide or passivation layer, the more pronounced the damage effect. The combination of these results removes any ambiguity; the oxygen atoms are progressively displaced by the analyzing probe, and the increase in channeling yield cannot be attributed to an increase in oxide thickness, since the total amount of oxygen is either stable or decreasing.

Figure 4:
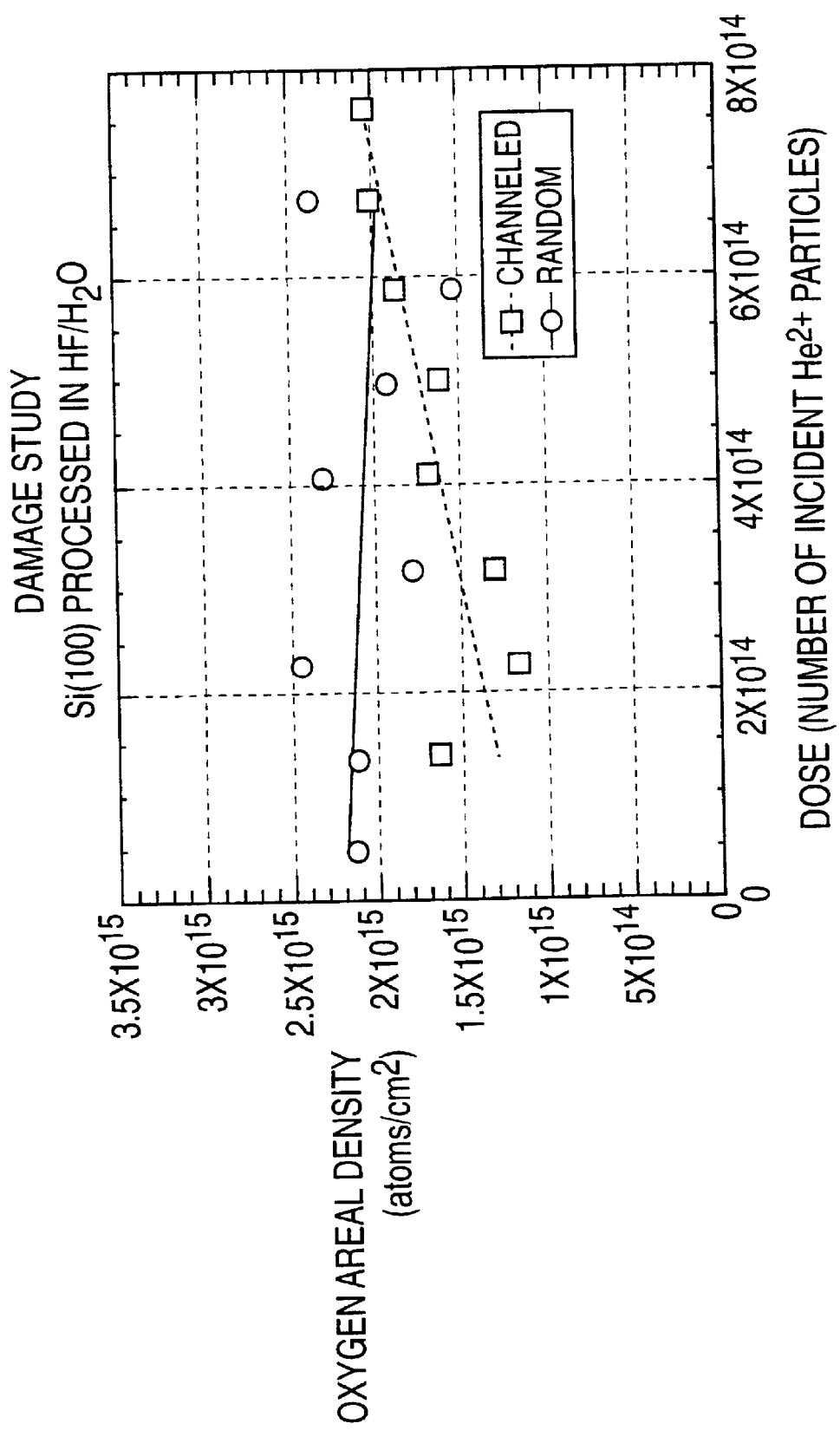
FIG. 4 is a diagrammatic illustration of plot of oxygen areal density versus ion dose in ion beam analysis.

FIG. 4 shows an exemplary plot of channeling yield versus dose (number of incident $^4He^{2+}$ particles). As discussed above, the similarity between the atomic masses of the $^4He^{2+}$ particle and oxygen results in a fair amount of disruption of the ordered nature of the surface. By extrapolating to zero dosage, the degree of ordering of the unbombarded surface can be obtained. Hence, the channeling yield and the random yield are always measured as the intercept of the damage curve with the oxygen yield axis, which corresponds to the initial oxygen yield prior to analysis. The curve is linear, as it is well known that the number of atomic displacements scales linearly with ion dose at low dosages. This procedure also has the advantage of decreasing the uncertainty on the measured oxygen yield since it is based on a large set of IBA measurements. The typical error in the oxygen coverage is $2.0 \times 10^{14}$ atoms/cm$^2$ for channeling, and higher for the coverage measured via rotating random ($7.3 \times 10^{14}$ atoms/cm$^2$) because of the lower signal-to-noise ratio in individual rotating random spectra.

The normalized channeling yield, denoted as $\chi$, is the ratio of the channeling yield to random yield and scales with the degree of alignment of oxygen with each other. As damage increases during analysis, atoms can be relocated inside the crystal lattice and the detection of these atoms is thus enhanced. $\chi$ can then increase from below 1 to above 1, as observed during an angular scan. In damage curves, this is seen when the channeling yield, initially always lowest ($\chi<1$) increases and in some cases reaches values above the random yield ($\chi>1$).

Fourier transform infrared spectrophotometry in an attenuated total reflectance mode (FTIR-ATR) was performed on a Nicolet Model 800 IR Spectrometer from Nicolet Instrument Corporation of Madison, Wisconsin. An accessory designed and manufactured by PIKE Technologies of Madison, Wisconsin used for FTIR-ATR holds whole Si wafers ranging in diameter from 100 to 200 mm without cutting the wafer or processing to create a multiple reflection element. The accessory provides good optical contact and reproducible clamping pressure, reducing fluctuations with applied pressure, wafer curvature, and particulates in the instrument. The experiment uses $\pi$-polarized radiation and a 4 cm$^{-1}$ resolution. By using $\pi$-polarized radiation with a 60° Ge ATR (Attenuated Total Reflection) element, components perpendicular to the surface are preferentially excited. The intensity enhancement obtained using $\pi$-polarization is approximately a factor of 2.4 greater than unpolarized radiation. 256 scans were signal-averaged to achieve a higher signal-to-noise ratio. Samples are referenced against a wafer chemically oxidized in a solution prepared as described for 21 (i.e. 4:1:1 $H_2O:H_2O_2: NH_4OH$). Spectral analysis is performed using the Omnic software of Nicolet Instrument Corporation of Madison, Wis. Because the Ge crystal can be contaminated or damaged over time and the difficulty of making reproducible contact, the best comparisons are obtained for FTIR performed on the same day. This caused (and always causes) the day-to-day IR absorptions for the same peak to fall within a broader range than is seen in traditional FTIR measurements. Measurements are averaged across the wafer diameter. For these measurements FTIR spectra were recorded within 24 hours of chemical treatment.

Interface Phase/SiO$_2$-Overgrowth

The method disclosed herein first forms a very thin region upon which the thin film dielectric can be grown. This region is called the interface phase. The interface phase because of its thinness is difficult to characterize, but FTIR shows no evidence of Si-H bonding. The dielectric overlayer that grows on the interface phase is believed to be a separate phase from that of the interface phase because the two phases have different atomic densities.

Because SiO$_2$ is well-known to be a polymorphic material (multiple phases with the same stoichiometry), the interface phase and the ultra-thin SiO$_2$ grown thereon are believed to be polymorphic as well. As the phases change, the density and other mechanical properties of the materials change as well. Control over the phases of ultra-thin SiO$_2$ and the interface phase translates into control of density and, consequently, atomic positions within the phase. Ultimately, this measure of control allows selection of mechanical properties (e.g. stress and warping), optical properties (e.g. refractive index) and electrical properties (e.g. dielectric constant). The capability of modulating these and other properties has tremendous implications for ultra-thin devices. For example, the paramount importance of increasing the dielectric constant as devices become smaller has been discussed above. The change in mechanical properties can be responsible for improving interface defect density; an improvement is observed even if the phase is not ordered, indicating that the change in mechanical properties (plasticity and elasticity) decreases stress locally and thus decreases defect generation.

The interface phase serves multiple roles, among those are its function as a dielectric, as a seed layer, and as a barrier. The dielectric function has been discussed. When the phase acts as a seed layer, it does so by allowing atoms of the over-layer to arrange themselves without regard to the atomic arrangement of the substrate.

The interface phase acts as a barrier. When the interface phase forms, it segregates the semiconductor underneath from any heterodielectric or other material deposited on the surface. This segregation prevents reaction between the substrate and the overlayer and thereby prevents cross contamination between the substrate and a deposited overlayer. Semiconductor substrates can include Si, $Si_xGe_{1-x}$, GaAs, $Si_{1-x-y}Ge_xC_y$, $Si_{3(1-x)}Ge_{3x}N_{4(1-\delta)}$, Ge, $Si_xGe_{(1-x)}(O_yN_{1-y})_n$, $Si_{1-x-y}Ge_xC_y(O_zN_{1-z})_n$, $(Si_{1-x-y}Ge_xC_y)_3N_{4-x-y}$, and GaAlAs. Useful heterodielectrics can include $CaF_2$, $BaF_2$, $SrTiO_3$, $Pb(ZrTi)O_3$, $BaTiO_3$, $Zr(Ca)O_2$, $Zr(Y)O_2$, $LiNbO_3$, $(LiNbO_3, SrTiO_3)$, $(Zr—Ca)O_2$, $Zr(Y)O_2)$, GaAs, $Ga_2O_3$ $As_2O_5$, CdTe, InP, ZnSe, ZnS, HgCdTe, GaSb,InSb, Yttrium Barium Copper Oxide, Lanthanum Strontium Copper Oxide and Barium Europium Copper Oxide.

The $SiO_2$ based phases that form on the interface phase are at least three in number. The phases are classified based on their density relative to $SiO_2$. Type-A ultrathin $SiO_2$, ordered or not, has a density similar to $SiO_2$. Type-B ultra-thin $SiO_2$, order or not, has a density up to 25–30% lower than $SiO_2$. Type-C ultra-thin $SiO_2$, again ordered or not, has a density greater than $SiO_2$. Thus, the thin film dielectric discussed herein can be one of at least three phases when $SiO_2$ is the chosen dielectric.

Any combinations of these ultra-thin $SiO_2$ phases produces a decrease in the interface defect density. The term any combination encompasses mixed phases such as $A_{1-x}B_x$, $A_{1-x-y}B_xC_y$, $A_{1-x}C_x$, etc. The improvement in interface defect density is expected to be even greater when pure A, B or C ultra-thin $SiO_2$ phases are grown.

The state of the art measurements for evaluating interface quality include measurement of trapped charge in the oxide, carrier lifetime, and capacitance. The state of the art values typically seen for $SiO_2$ on Si substrates are listed below. Note that the oxide layer is around 33 Å thick and that these measurements are dependent on thickness. The trapped charge seen commercially is between $8-20 \times 10^{10}$ electrons/$cm^2$. The values seen for dielectrics made by the process of this invention range from $4-6.5 \times 10^{10}$ electrons/$cm^2$ when measured on a thinner film. This translates into values for the trapped charge for the interface phase and overlaying dielectric that are on average at least twice as good as commercially practiced. The carrier lifetime for charge carriers in the film of this invention are 1.5 to more than 2 times better than conventionally prepared oxides. The capacitance is measured to be about 10–30% higher for films 10–30% thinner. The capacitance measurement correlates directly with dielectric constant. The higher the capacitance value, the higher the quality of the dielectric. A thinner film should not yield a higher capacitance unless the dielectric is of a significantly higher quality.

The values listed above show that the ultra-thin film dielectrics of the present invention perform significantly better than those in commercial use. This improvement is observed even though no ordering is observed beyond the interface for the present dielectrics. Better ordered dielectric films will surpass the values listed above.

Device Manufacture

The process of this invention can be used to make a variety of different semiconductor devices including transistors, diodes, capacitors, resistors, memory, and charge-coupled devices. A transistor made using the process of this invention is illustrative.

Figure 5A:
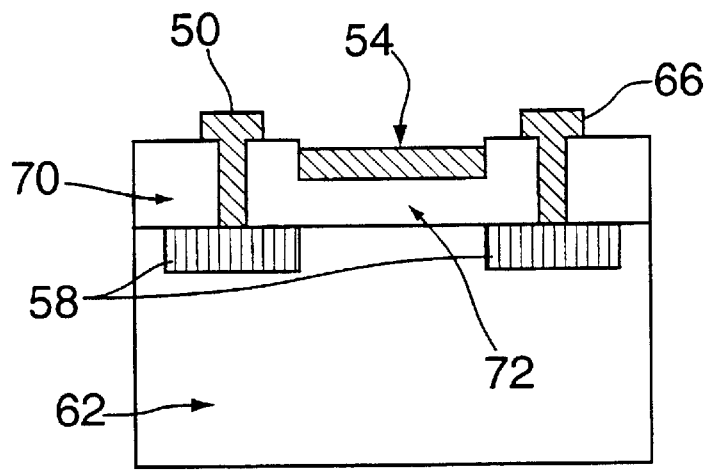
FIG. 5A is a diagrammatic illustration of a MOS transistor structure showing a prior art transistor.
Figure 5B:
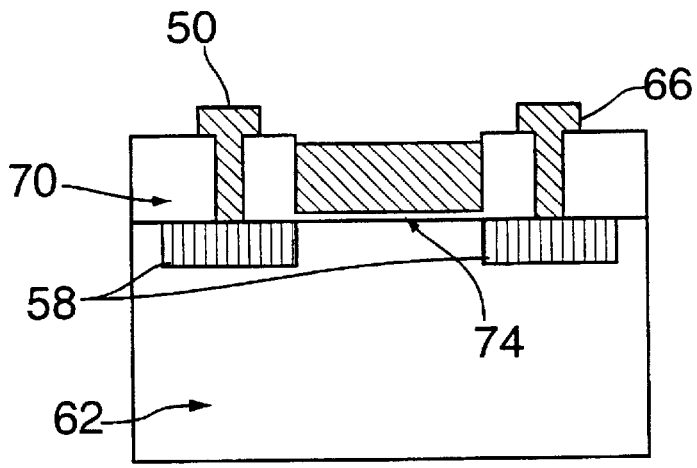
FIG. 5B is a diagrammatic illustration of a MOS transistor structure showing an embodiment of this invention wherein the interface phase functions as a gate oxide dielectric.
Figure 5C:
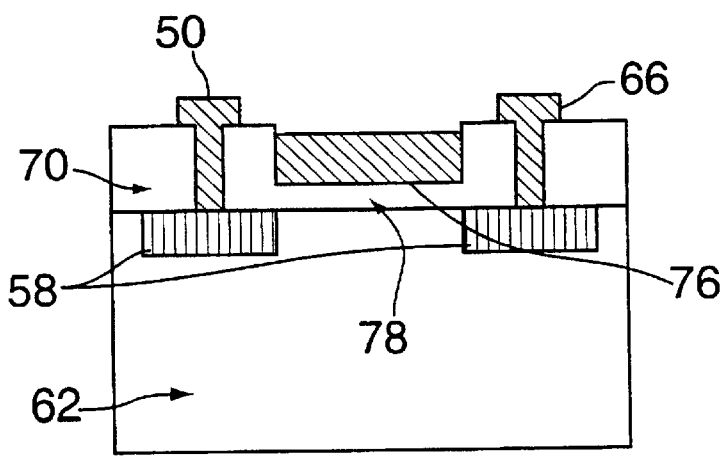
FIG. 5C is a diagrammatic illustration of a MOS transistor structure showing an embodiment of this invention wherein the interface phase plus ultra-thin dielectric film of the present invention function as a gate oxide dielectric.

In FIG. 5A, a field-effect transistor 50 has a source 52, a gate 54, and a drain 66. All of these portions are formed of the electrode metal and are well known in the art. Regions 58 and 62 are n-type and p-type semiconducting material respectively. A layer 70 is a dielectric material. Dielectric material layer 72 is the portion of the standard MOSFET that forms the gate-oxide dielectric. It is known in the art. In FIG. 5B, an ultra-thin gate-oxide dielectric 74 is a dielectric layer formed in the process of this invention. This film can be as thin as 0.5 nm. In FIG. 5C, a thicker gate-oxide 76 is a dielectric layer formed in accordance with the present invention including the final oxidation step described above. An interface layer 78 remains highly ordered with a low interface defect density after the thickness of the gate-oxide is increased in the final oxidation.

The process of making integrated circuit transistors is well known in the art. These processes employ layers of dielectric material in various configurations depending on the nature of the device. The process disclosed can be used to form those dielectric material layers.

EXAMPLES

Procedures that are common to each of the examples enumerated below are described first. Following that description, each enumerated example sets forth details specific to that experiment along with the relevant observed data.

Semiconductor specimens were prepared in a chemical laminar flow hood, constructed of polypropylene, in a Class 100 clean room. The clean room minimizes contamination of the samples. Unless otherwise specified, reagents were part per billion grade chemicals and were classified as Class 10 clean room suitable. Experiments on silicon used boron doped silicon(100) wafers, which had a resistivity of 10 to 14 ohm·cm. Two types of silicon specimens were used: 1) 1 by 1 inch pieces and 2) 100 mm wafers. The 1 by 1 inch pieces were manually cut from a wafer using a diamond scribe in a Class 100 laminar flow hood located in the clean room. These were transferred between chemical treatments in a polytetrafluoroethylene (PTFE) carrier. At each step of the process, samples were stored in PTFE sample holders for characterization. The 1 by 1 inch pieces were used for IBA.

The specimens were first treated with the degreasing solution at 80 degrees C. for 10 minutes. This solution was held at 80 degrees C. in a borosilicate glass container which was heated by placing the glass container in a polyvinyl butadiene tank filled with water. The water was heated by an immersion heater and was thermally regulated. The degreasing solution had a composition of 4:1:1 parts of $H_2O:H_2O_2:NH_4OH$ by volume. After immersion in the degreasing solution, the specimens were rinsed in 18.3 megohm resistivity DI $H_2O$ for five minutes and dried with $N_2$.

After the water rinse, the specimens were immersed in an etching solution for a period of time as specified below for each example. The etching solution was held at room temperature and was prepared by mixing 49% HF solution and $H_2O$ at a ratio of 2:98 HF solution:$H_2O$. Following the etching solution, the specimens were again rinsed in 18.3 megohm resistivity DI $H_2O$ for five minutes and dried with $N_2$.

Following the etching step, in a primary oxidation step, the surface of each specimen was oxidized in a solution held at 80° C. for ten minutes using the same type water bath as described above with respect to degreasing. This reoxidizing solution was prepared as 4:1:1 $H_2O$: 25–40% $H_2O_2$: 25–40% Hcl solution. After the oxidation step, the specimens were again rinsed in DI $H_2O$ and dried with $N_2$. Next, the process included the passivation step. The above listed steps were repeated for each of the below listed examples unless otherwise specified. For a number of the specimens, the passivation step ended the procedure. In general, in all rinse steps, whether the solvent was water or another solvent, the solvent was deoxygenated by purging with $N_2$ gas.

As a comparative example, silicon (100) pieces etched in a solution of 1:99 $HF:H_2O$ were analyzed by IBA. The total amount of oxygen was $8.3\pm1.2\times10^{15}$ oxygen atoms/cm$^2$. Oxygen measured in the <111> direction gives a measurement of $3.9\pm0.32\times10^{15}$ oxygen atoms/cm$^2$. Thus the average unchanneled fraction in this case is about half: $0.47\pm0.05$. Other than etching, this example does not employ the pre-passivation steps before the passivation-type immersion step discussed.

As another comparative example, silicon (100) etched in a solution of 1:9 HF:methanol gives a total oxygen coverage of $6.3\pm0.2\times10^{15}$ oxygen atoms/cm$^2$. The <111> direction yields $4.2\pm0.6\times10^{15}$ oxygen atoms/cm$^2$. The average unchanneled fraction is high $0.68\pm0.14$. Thus the ordering is even lower and poorer when an isolated passivation step in alcohol is used rather than in water. Again, other than the etching, this example does not employ the pre-passivation steps before the passivation-type immersion step.

Several operative examples are included below along with pertinent experimental data in tabular form. The operative examples are followed by a discussion of the data. In each example the substrate was prepared as described above. The difference between the examples lies in the passivation step as described below. All FTIR peaks are reported by the approximate wavenumber of their absorption, note that FTIR-ATR absorptions positions are typically not as reproducible day-to-day as traditional FTIR measurements.

Example 1

1:9 HF/methanol 1'–5' rinse in DI $H_2O$

In this example, the passivation solution is 1:9 HF solution:methanol. After the pre-passivation steps were completed, the specimen (boron-doped Si(100) wafer) was immersed in the passivation solution for one minute. This treatment was followed by a rinse in deionized water for 5 minutes.

IR. cm$^{-1}$
~970
~1216
~1667
~2111
~2140
~3374

IBA

Carbon areal density $7\times10^{15}$ atoms/cm$^2$
Oxygen areal density $5.0\times10^{15}$ atoms/cm$^2$
Hydrogen areal density $4\times10^{15}$ atoms/cm$^2$

TM AFM

Smoothness=0.1 nms nm

Example 2

1:9 HF methanol 1'–five minute 5' rinse in methanol

In this example, the passivation solution was 1:9 HF solution:methanol. After the pre-passivation steps were completed, the substrate (boron-doped, Si (100)) was immersed in the passivation solution for one minute. This treatment was followed by a rinse in methanol for five minutes.

Data:
IR, cm$^{-1}$
~970
~1216
~1448
~1667
~2111
~2140
~3374

IBA

Carbon areal density: $7\times10^{15}$ atoms/cm$^2$
Oxygen areal density: $5\times10^{15}$ atoms/cm$^2$
Hydrogen areal density: $4\times10^{15}$ atoms/cm$^2$

TMAFM

Smoothness=0.1 rms nm

Example 3

1:9 HF:2-propanol 1'–5' rinse in DIH$_2$O

In this example the passivation solution was 1:9 HF solution: 2-propanol (isopropyl alcohol). After the pre-passivation steps were completed, the substrate (boron-doped Si(100) wafer) was immersed in the passivation solution for one minute. This treatment was followed by a rinse in deionized water for 5 minutes.

Data:
IR, cm$^{-1}$
~966
~1044
~1210
~2111
~2142
~3391

| IBA | |
|---|---|
| Carbon areal density: | $6\times10^{15}$ atoms/cm$^2$ |
| Oxygen areal density: | $5\times10^{15}$ atoms/cm$^2$ |
| Hydrogen areal density: | $3\times10^{15}$ atoms/cm$^2$ |

TMAFM

Smoothness=0.1 rms nm

Example 4

1:9 HF:ethanol 1'–5' rinse in DI $H_2O$

In this example the passivating solution was 1:9 HF solution: ethanol. After the pre-passivation steps were completed, the substrate (boron-doped Si(100) wafers) was immersed in the passivation solution for one minute. This treatment was followed by a rinse in deionized water for 5 minutes.

Data:
IR cm$^{-1}$
~1035
~1211
~2111
~2141

| IBA | |
|---|---|
| Carbon areal density: | 6 × 10$^{15}$ atoms/cm$^2$ |
| Oxygen areal density: | 5 × 10$^{15}$ atoms/cm$^2$ |
| Hydrogen areal density: | 3 × 10$^{15}$ atoms/cm$^2$ |

TMAFM

Smoothness=0.2 rms nm

Example 5

1:9 HF:ethanol 1–5 rinse in ethanol

In this example the passivating solution was 1:9 HF solution:ethanol. After the pre-passivation steps were completed, the substrate (boron-doped Si (100) wafers) immersed in the passivation solution for 5 minutes. This treatment followed by a rinse in ethanol for 5 minutes.

Data:
~1035
~1211
~2085
~2111
~2141
~2856
~2926
IBA

| Carbon areal density: | 6 × 10$^{15}$ atoms/cm$^2$ |
|---|---|
| Oxygen areal density: | 4.6 × 10$^{15}$ atoms/cm$^2$ |
| Hydrogen areal density: | 3.3 × 10$^{15}$ atoms/cm$^2$ |

TMAFM

Smoothness=0.1 rms nm

1–4 nm thick SiO$_2$ films were grown on passivated, ordered Si(100) in order to correlate electrical properties and oxidation rates with Si(100) processing for ultrathin gate oxides. Ordered (1×1) Si(100) stable in ambient air is obtained at room temperature by wet chemical cleaning [1]. The thickest oxides are grown by Rapid Thermal Oxidation or furnace oxidation at 1100° C., and the thinnest oxides are grown at room temperature. These oxides are labeled here "ordered" because of the initial ordering along SiO$_2$/Si(100).

Capacitance-Voltage and Current-Voltage measurements are generally inconclusive for ultra-thin (1–2 nm) oxides because of leakage and breakdown. But surface channel analysis (SCA), which measures the interface charge, enables comparison between the "ordered" oxides and conventionally prepared oxides. When compared to a 3.2 nm thermal oxide, some of the "ordered" oxides exhibit a lower oxide charge density, and a minority carrier lifetime twice that measured for a conventionally prepared thermal oxide. These electrical results appear to be independent of whether ordering is detected beyond the interface or not, but is dependent on the initial Si(100) surface preparation and ordering.

| | Thickness Å | Qoxide δ | Ts (µs) | Cap. (Ff/µm2) | Leakage (A/cm$^2$) |
|---|---|---|---|---|---|
| Conventional annealed | 32 | 8 e10 | 60 | 9 | 4 e-9 |
| Conventional un-annealed | 32 | 2 e11 | 475 | 9 | 4 e-9 |
| JC2-4 | 23 | 4.12 e10 | 133 | 9.9 | 4.27 e-8 |
| JC2-7 | 22 | 3.63 e10 | 125 | 9.8 | 8.55 e-8 |
| JO11-4 | 26 | 6.43 e10 | 96 | 11.5 | 2.09 e-7 |

The reproducability of coverage using IBA on identical samples (not all data included here) show that the process of the invention produces oxygen, hydrogen, and carbon coverages that are reproducible run to run.

Other experiments show that hydrogen coverage increases monotonically as the immersion time in the passivation solution increases when the passivation solution is methanol based. The areal density of oxygen for all samples shows sufficient oxygen to form at least a layer of SiO with some areas of SiO$_2$. Obviously SiO must have another constituent to fill the empty oxygen valence since the areal coverage indicates one oxygen per silicon atom. The most likely candidate is hydrogen, because it is present in a sufficient amount.

In all FTIR-IR experiments, 1:9 HF:alcohol was used. The absorption frequencies observed for the different SiH$_x$ species correspond to monohydrides at 2070–2090 cm$^{-1}$, dihydrides at 2090–2120 cm$^{-1}$, and trihydrides at 2120–2150 cm$^{-1}$. Dihydrides and trihydrides were more prominent at 2110 cm$^{-1}$ and 2140 cm$^{-1}$ respectively. Splitting of the dihydride peak was very apparent. SiO$_2$ was detected around 1215 cm$^{-1}$. The dihydride signal was the most prominent and most abundant SiH$_x$ species detected for all HF:alcohol and aqueous HF solutions. The monohydride was not present in all cases. The total amount of SiH$_x$ species measured decreased with etching time in HF:alcohol, whereas, IBA showed an increase in the net amount of hydrogen. Since IBA detects the absolute coverage of hydrogen independent of its chemical state while FTIR detection is sensitive to the bonding of the hydrogen, it can be concluded that the increased amount of hydrogen does not bond to silicon only. The amount of oxide removed is lower for aqueous HF than for HF:alcohol also. In summary, FTIR correlates well with the IBA compositional analysis which showed that the surface is terminated by at least one continuous layer of SiO, and a discontinuous layer of SiO$_2$. The hydrogen bonds to the surface through SiOH bonds or through a more complex combination of Si and O atoms. Note that the FTIR shows O-H absorption bands that point to the formation of SiOH as well.

| FTIR Absorptions | |
|---|---|
| Species | Absorption, cm$^{-1}$ |
| SiH | 2070–2090 |
| SiH$_2$ | 2090–2120 |
| SiH$_3$ | 2120–2150 |
| SiO$_2$ | ~1215 |

TMAFM images are scanned over an area of 2×2 µm$^2$. Surface roughness rms values as given for a small particulate-free area. Surfaces treated in 1:9 HF:alcohol followed by various rinses show similar rms values for smoothness when compared to the reference aqueous HF (1:98 parts of HF:$H_2O$) when followed by a water rinse. A value of 0.1 nm rms means the standard deviation of atom height is 0.1 nm. In this process, the smoothness can also be measured by counting the steps in the surface on a cross-section of that surface observed by high resolution Transmission Electron Microscopy (See FIGS. 6A–B). Steps occur when a change in the plane of the atoms occurs. If one walked on the surface, a lack of smoothness would appear like a step of atoms. A perfectly flat surface has no steps. Typical surface preparations have one step per 10–20 Å while surfaces prepared per this invention have one step per 100–200 Å as seen in FIGS. A–B.

High resolution transmission electron microscopy shows increased ordering and/or a phase change for the dielectric layer as well. In the case of Si(100) simply etched in HF:$H_2O$ (2:98) FIG. 6A, the total amount of oxygen is $8.3 \pm 1.2 \times 10^{15}$ oxygen atoms/$cm^2$ when averaged over three identically processed wafers. This value agrees with that determined by IBA. The oxide geometrical thickness as measured by High Resolution Transmission Electron Microscopy (HRTEM) is 1.8 nm. For Si(100) etched solely in HF:methanol (1:9) such as in FIG. 6B, the O coverage is $6.3 \pm 0.2 \times 10^{15}$ oxygen/$cm^2$ when averaged over three identically processed wafers.

However, even though the oxygen content differs by 25%, the oxide geometrical thickness measured by High Resolution Transmission Electron Microscopy (HRTEM) is also 1.8 nm. FIGS. 6A and 6B compare two HRTEM images: FIG. 6A Si(100) simply etched in HF:$H_2O$ (2:98) while FIG. 6B depicts si(100) etched solely in HF:methanol (1:9).

In FIGS. 6A and 6B, the $SiO_2$ layer 120 has formed as an oxide film on the silicon layer 125. FIG. 6A shows that on average, all atoms in the oxide film appear displaced from lattice positions. However, in FIG. 6B, the $SiO_2$ films obtained after a modified RCA clean followed by etching in HF:methanol (1:9) exhibit flat, periodic interfaces with si(100). The oxide formed on Si(100) etched in HF:$H_2O$ (2:98) exhibits more rippled interfaces.

The 25% difference in areal density between the two films in FIGS. 6A and 6B despite their fairly close geometrical thickness is a result of the volume expansion that accompanies oxygen insertion in Si(100). This volume expansion can be accommodated partially by tetragonal strain, manifested normal to the (100) planes, and partially by periodic "rippling" in the (100) plans along the (100) interface. This data demonstrates that different interface phases of $SiO_2$ are formed by this method. The reduction in steps at the interface results in a decrease in interface defect (defect) density as shown below.

The process described for producing a ultra-thin, low interface density defect layers forms an interface phase and for a dielectric material layer with a composition including at least silicon, oxygen and hydrogen. To a certain extent the exact composition and structure of the thin dielectric film thus formed is not necessarily ascertained (or ascertainable). A fairly wide range of composition still yields a low interface defect density. The interface phase and/or film can be characterized by data representing its physical characteristics or by the process by which it is made.

From the foregoing, it appears that the following choices are most efficacious in the practice of the process for forming the ultra-thin dielectric layers of the invention: The degreasing step 21 uses a 10 minute immersion in a degreasing solution kept at 80° C. The degreasing solution is 4:1:1 $H_2O$:$H_2O_2$: $NH_4OH$. The substrate is rinsed, at step 31, in 18.3 megohm resistivity deionized water. The etching step 22 uses a solution of 98 parts water to 2 parts 49% HF solution. The immersion time is two minutes. Again, at step 23, the substrate is rinsed after the etching step in 18.3 megohm deionized water. The primary oxidation step 24 uses a 4:1:1 $H_2O$ to $H_2O_2$:HCl solution. The substrate remains immersed in the solution for 10 minutes, and the solution is held at 80° C. At step 25, the substrate is rinsed in 18.3 megohm deionized water. The final step is the passivation step 26. The solution used is 1:9 HF solution to methanol. The solution is used at room temperature. This step is followed by a rinse 27 in methanol.

While the subject invention is described above in detail with reference to various embodiments, it will be understood that changes and modifications can be made to the described embodiments without departing from the spirit and scope of the invention as defined in the appended claims.

What is claimed is:

1. A method of producing interface phase on a surface of a crystalline semiconductor substrate comprising the steps of:
    a) etching the substrate surface until substantially all native oxide and at least several elemental or multi-elemental layers of bulk substrate are removed; followed by:
    b) re-oxidizing the surface of the substrate; and
    c) after step (b) removing oxide formed on the surface in step (b) and passivating the surface to produce a resulting film that has long-range ordering and a low interface defect density.

2. The method of claim 1, wherein the interface phase has a thickness between about one half and about ten nm.

3. The method of claim 1, wherein after step (c) the substrate has one surface atomic step per 100 Å or more linear distance.

4. The method of claim 1, further comprising the step of:
    a) immersing the substrate in a degreasing solution comprising water, an oxidizing agent, and a base; and thereafter
    b) rinsing the substrate,
whereby the degreasing solution substantially completely removes organic contaminants from the substrate and the rinsing step substantially completely removes the degreasing solution from the substrate.

5. The method of claim 1, wherein etching comprises the steps of:
    i) removing native oxide and initial elemental layers of the substrate by immersing the substrate in an etching solution, and subsequently
    ii) rinsing the substrate.

6. The method of claim 5, wherein the etching solution comprises hydrofluoric acid solution and water.

7. The method of claim 1, wherein step (c) comprises:
    i) immersing the substrate in an oxidizing solution comprising water, an oxidizing agent, and an acid; and subsequently
    ii) rinsing the substrate.

8. The method of claim 7, wherein the oxidizing agent is selected from the group consisting of hydrogen peroxide, nitric acid, and hydrochloric acid.

9. The method of claim 7, wherein the oxidizing solution comprises water, hydrogen peroxide, and hydrochloric acid.

10. The method of claim 9, wherein the oxidizing solution comprises about 4 parts water, about 1 part 25–40% hydrogen peroxide solution, and about 1 part 25–40% concentrated hydrochloric acid, each component measured by volume.

11. The method of claim 1, wherein passivating comprises:
 i) immersing the substrate in a passivating solution comprising a solvent and an etchant capable of dissolving any oxide on the surface of the substrate; and
 ii) rinsing the substrate to substantially remove the etchant.

12. The method of claim 11, wherein rinsing further comprises using at least one of water, an alcoholic solvent or a non-alcoholic solvent.

13. The method of claim 11, wherein the solvent is at least one of water, methanol, ethanol, 1-propanol, 2-propanol, 1-butanol, and 2-butanol.

14. The method of claim 11, wherein the etchant is an acid.

15. The method of claim 14, wherein the etchant is hydrofluoric acid.

16. The method of claim 1, further comprising the step of oxidizing the substrate in a further final oxidation step.

17. The method of claim 16, wherein the step of oxidizing the substrate in a further final oxidation step comprises, increasing the thickness of material formed on the substrate surface from about 0.25 nm to about 100 nm.

18. The method of claim 16, wherein the substrate is a semiconductor and the further final oxidation step is a semiconductor oxidation process.

19. The method of claim 1, wherein the substrate is a semiconductor material selected from the group consisting of Si, $Si_xGe_{1-x}$, GaAs, $Si_{1-x-y}G_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_xN_{1-z})_n$ and $(Si_{1-x-y}Ge_xC_y)_3N_{4-x-y}$.

20. A method of producing ultra-thin films of interface phase material on a semiconductor substrate comprising:
 a) providing a semiconductor substrate;
 b) substantially completely removing organic contaminants from a surface of the substrate;
 c) etching the substrate surface until substantially all native oxide and at least several elemental or multi-elemental layers of bulk substrate are removed; followed by:
 d) re-oxidizing the surface; and
 e) after step (d), removing oxide formed on the surface in step (d) and passivating the surface with a non-oxide passivation dielectric layer.

21. The method of claim 20, wherein step (a) comprises providing a crystalline semiconductor substrate.

22. The method of claim 21, wherein step (b) comprises degreasing the surface.

23. The method of claim 21, wherein step (e) comprises producing an ultra-thin layer of dielectric on the surface, wherein the ultra-thin layer exhibits long-range ordering.

24. The method of claim 23, wherein producing an ultra-thin layer comprises producing an interface phase material of between about 0.5 and about 10 nm.

25. The method of claim 24, further comprising the step of oxidizing the substrate in a final oxidation step subsequent to step (e).

26. An ultra-thin film interface phase material on a crystalline semiconductor substrate prepared by a process comprising the steps of:
 a) degreasing a surface of the substrate;
 b) etching the surface until substantially all native oxide and at least several elemental or multi-elemental layers of bulk substrate are removed; followed by:
 c) re-oxidizing the surface of the substrate in a primary oxidation step; and
 d) after step (c), removing oxide formed on the surface in step (c) and passivating the surface to produce a dielectric material layer that has long-range order and a low interface defect density.

27. The material of claim 26, wherein the dielectric material has a thickness substantially between about one-half and about ten nm.

28. The material of claim 26, wherein degreasing comprises:
 i) immersing the substrate in a degreasing solution comprising water, an oxidizing agent, and a base; and
 ii) rinsing the substrate,
whereby the degreasing solution substantially completely removes any organic contaminants from the substrate and the rinsing step substantially completely removes the degreasing solution from the substrate.

29. The material of claim 26, wherein etching the surface of the substrate comprises the steps of:
 i) removing native oxide and initial elemental layers of the substrate by immersing the substrate in an etching solution containing an etchant, and
 ii) rinsing the substrate.

30. The material of claim 26, wherein step (c) comprises:
 i) immersing the substrate in an oxidizing solution comprising water, an oxidizing agent, and an acid; and
 ii) rinsing the substrate in water.

31. The material of claim 26, wherein the oxidizing agent is selected from the group consisting of hydrogen peroxide, nitric acid, and hydrochloric acid.

32. The material of claim 30, wherein the oxidizing solution comprises water, hydrogen peroxide, and hydrochloric acid.

33. The material of claim 32, wherein the oxidizing solution comprises about 4 parts water, about 1 part 25–40% hydrogen peroxide solution, and about 1 part concentrated hydrochloric acid each component measured by volume.

34. The material of claim 26, wherein passivating comprises:
 i) immersing the substrate in a passivating solution comprising a solvent and an etchant capable of dissolving any oxide on the surface of the substrate; and
 ii) rinsing the substrate to substantially remove the etchant.

35. The material of claim 34, wherein rinsing further comprises using at least one of water, an alcoholic solvent and a non-alcoholic solvent.

36. The material of claim 34, wherein the solvent is at least one of water, methanol, ethanol, 1-propanol, 2-propanol, 1-butanol, and 2-butanol.

37. The material of claim 34, wherein the non-alcoholic solvent of the passivating solution in claim 34 is at least one of methanol, ethanol, 1-propanol, 2-propanol, 1-butanol, and 2-butanol.

38. The material of claim 34, wherein the etchant is selected from the group consisting of hydrofluoric acid, $H_2SO_4$, and $HNO_3$.

39. The material of claim 26, further comprising the step of oxidizing the substrate in a final oxidation step subsequent to step (d).

40. The material of claim 39, wherein the step of oxidizing the substrate in a further final oxidation step comprises, increasing the thickness of the film on the substrate surface from about 0.25 nm to about 100 nm.

41. The material of claim 39, wherein the substrate is a semiconductor and the further final oxidation step is a semiconductor oxidation process.

42. The material of claim 26, wherein the substrate is a semiconductor material selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$.

43. A semiconductor device including a dielectric interface phase material prepared by a process comprising the steps of:
 a) degreasing the surface of a crystalline semiconductor substrate;
 b) etching a substrate surface until substantially all native oxide and at least several elemental or multi-elemental layers of bulk substrate are removed; followed by:
 c) re-oxidizing the surface of the substrate in a primary oxidation step; and
 d) after step (c), removing oxide formed on the surface in step (c) and
passivating the surface of the substrate to produce a dielectric material layer that has a low interface defect density and long-range ordering.

44. The semiconductor device of claim 43, wherein the device is a MOS device, and the dielectric material forms a dielectric layer separating a gate from the semiconductor substrate.

45. The semiconductor device of claim 43, wherein the resulting dielectric material is between about one-half and about ten nm.

46. The semiconductor device of claim 43, wherein etching comprises the steps of:
 i) removing native oxide and initial elemental layers of the substrate by immersing the substrate in an etching solution containing an etchant; and
 ii) rinsing the substrate with water.

47. The semiconductor device of claim 43, wherein step (c) comprises:
 i) immersing the substrate in an oxidizing solution comprising water, an oxidizing agent, and an acid; and
 ii) rinsing the substrate.

48. The semiconductor device of claim 47, wherein the oxidizing agent is selected from the group consisting of hydrogen peroxide, nitric acid, and sulfuric acid.

49. The semiconductor device of claim 47, wherein the oxidizing solution comprises water, hydrogen peroxide, and hydrochloric acid.

50. The semiconductor device of claim 49, wherein the oxidizing solution comprises about 4 parts water, about 1 part 25–40% hydrogen peroxide solution, and about 1 part concentrated hydrochloric acid.

51. The semiconductor device of claim 43, wherein the passivating step comprises:
 i) immersing the substrate in a passivating solution comprising a solvent and an etchant capable of dissolving any oxide on the surface of the substrate; and
 ii) rinsing the substrate to substantially remove the etchant.

52. The semiconductor device of claim 51, wherein rinsing further comprises using at least one of water, an alcoholic solvent or a non-alcoholic solvent.

53. The semiconductor device of claim 51, wherein the solvent is at least one of water, methanol, ethanol, 1-propanol, 2-propanol, 1-butanol, and 2-butanol.

54. The semiconductor device of claim 51, wherein the etchant is hydrofluoric acid:methanol (1:9).

55. The semiconductor device of claim 43, further comprising the step of oxidizing the substrate in a final oxidation step subsequent to step (d).

56. The semiconductor device of claim 55, wherein the step of oxidizing the substrate in a final oxidation step comprises, increasing the thickness of the dielectric film on the substrate surface from about 0.25 nm to about 100 nm.

57. The semiconductor device of claim 55, wherein the substrate is a semiconductor and the final oxidation step is a semiconductor oxidation process.

58. The semiconductor device of claim 43, wherein the substrate is a semiconductor material selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$.

59. An ultra-thin film dielectric material comprising silicon, oxygen, and hydrogen, wherein the surface of the material has one surface atomic step per 100 Å or more.

60. The ultra-thin film dielectric material of claim 59, wherein the dielectric material has FTIR absorptions of:
 $cm^{-1}$
  950–1100
  1190–1225
  2105–2120
  2139–2145.

61. The ultra-thin film dielectric material of claim 59, wherein the dielectric material has FTIR absorptions of:
 $cm^{-1}$
  950–1100
  1190–1225
  2105–2120
  2139–2145
  2850–2860
  2910–2935.

62. The ultra-thin film dielectric material of claim 59, wherein the film is from about 0.25 to about 100 nm thick.

63. The ultra-thin film dielectric material of claim 59, wherein the dielectric material has a capacitance of substantially between 9.5 to 12 femtoFarads/square micrometer for a film with a thickness substantially between 22 and 26 angstroms.

64. The ultra-thin film dielectric of claim 59, wherein the dielectric has a low flat-band voltage.

65. The ultra-thin film dielectric of claim 64, wherein the dielectric has a flat-band voltage of less than about 0.65 Volts for a 20 angstrom thick film.

66. A semiconductor device having a dielectric layer comprising an ordered oxide of a semiconductor material chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n Si_{1-x-y}Ge_xC_y(O_zN_{1-z})_n$ and $(Si_{1-x-y}Ge_xC_y)_3N_{4-x-y}$, with long-range ordering and an ordered interface phase of oxygen and hydrogen all on an atomic polished surface of a substrate of the semiconductor material.

67. The device of claim 66, wherein the oxide layer comprises an oxidized surface layer of the substrate of the semiconductor material.

68. The device of claim 67, wherein the oxide layer is ultra thin.

69. The device of claim 68, wherein the oxide layer is substantially about 0.5 to 20 nm.

70. The device of claim 69, wherein the interface phase has long-range order and is less than 10 monolayers thick.

71. A composition of matter comprising an ultra-thin interface phase on a crystalline semiconductor surface, the interface phase exhibiting long range ordering.

72. The composition of matter of claim 71, further comprising a layer of oxide of the same semiconductor which is a semiconductor selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$.

73. A method of producing an atomically smooth crystalline semiconductor substrate surface comprising the steps of:
   a) degreasing the surface of the substrate;
   b) etching the substrate surface until substantially all native oxide and at least several elemental or multi-elemental layers of bulk substrate are removed; followed by:
   c) re-oxidizing the surface of the substrate; and
   d) after step (c), removing the oxide formed on the surface in step (c) and passivating the surface to produce a surface that has about one surface atomic step per 100 Å or more linear distance.

74. A method of producing an interface phase on a surface of a crystalline semiconductor substrate comprising the steps of:
   a) degreasing the surface of the substrate;
   b) etching the substrate surface until substantially all native oxide and at least several elemental or multi-elemental layers of bulk substrate are removed; followed by:
   c) re-oxidizing the surface of the substrate; and
   d) after step (c) removing the oxide formed on the surface in step (c) and passivating the surface by lowering the chemical reactivity of the surface to a reagent, thereby slowing the rate of surface reaction to the reagent; and
   e) reacting the reagent with the semiconductor at the surface thus treated to form ordered and commensurate layers of a product of the reaction having low flat-band voltage, charge carrier lifetime greater than 60 microseconds, and high capacitance.

75. A semiconductor device having a dielectric layer comprising long-range ordered oxidized semiconductor material on an atomically polished substrate of that semiconductor material with a smoothness characterized by one surface atomic step for 100 Å or greater linear distance, wherein the semiconductor material is chosen from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$.

76. The method of claim 1, wherein the interface phase material is an ultra-thin film of dielectric material.

77. The material of claim 26, wherein a final oxidation step in the process of its preparation form an ordered oxide material.

78. The semiconductor device of claim 55, wherein the final oxidizing step produces a thin dielectric oxide material having long-range ordering where closest to the substrate surface.

79. A composition of matter prepared on a surface of a crystalline semiconductor substrate by a method comprising the steps of:
   a) degreasing the surface of the substrate;
   b) etching a substrate surface until substantially all native oxide and at least several elemental or multi-elemental layers of bulk substrate are removed; followed by:
   c) chemically re-oxidizing the surface of the substrate; and
   d) after step (c), removing oxide formed on the surface in step (c) and passivating the surface to produce a resulting film that has long-range ordering and a low interface defect density.

80. The composition of matter prepared by the method steps of claim 79, wherein degreasing comprises the steps of:
   i) immersing the substrate in a degreasing solution comprising water, an oxidizing agent, and a base; and
   ii) rinsing the substrate,
whereby the degreasing solution substantially completely removes organic contaminants from the substrate and the rinsing step substantially completely removes the degreasing solution from the substrate.

81. The composition of matter prepared by the method steps of claim 79, wherein etching comprises the steps of:
   i) removing native oxide and initial elemental layers of the substrate by immersing the substrate in an etching solution, containing an etchant, and
   ii) rinsing the substrate.

82. The composition of matter prepared by the method steps of claim 79, wherein step (c) comprises:
   i) immersing the substrate in an oxidizing solution comprising water, an oxidizing agent, and an acid; and
   ii) rinsing the substrate in water.

83. The composition of matter prepared by the method steps of claim 82, wherein the oxidizing agent is selected from the group consisting of hydrogen peroxide, nitric acid, and hydrochloric acid.

84. The composition of matter prepared by the method steps of claim 82, wherein the oxidizing solution comprises water, hydrogen peroxide, and hydrochloric acid.

85. The composition of matter prepared by the method steps of claim 79, wherein step (d) comprises:
   i) immersing the substrate in a passivating solution comprising a solvent and an etchant capable of dissolving any oxide on the surface of the substrate; and
   ii) rinsing the substrate to substantially remove the etchant.

86. The composition of matter prepared by the method steps of claim 85, wherein rinsing further comprises rinsing with at least one of water, an alcoholic solvent or a non-alcoholic solvent.

87. The composition of matter prepared by the method steps of claim 85, wherein the solvent is at least one of water, methanol, ethanol, 1-propanol, 2-propanol, 1-butanol, and 2-butanol.

88. The composition of matter prepared by the method steps of claim 85, wherein the etchant is an acid.

89. The composition of matter prepared by the method steps of claim 88, wherein the etchant is hydrofluoric acid.

90. The composition of matter prepared by the method steps of claim 79, further comprising the step of oxidizing the substrate in a further final oxidation step.

91. The composition of matter prepared by the method steps of claim 90, wherein the step of oxidizing the substrate in a further final oxidation step comprises increasing the thickness of an interface phase material on the substrate surface from about 0.25 nm to about 100 nm.

92. The composition of matter prepared by the method steps of claim 90, wherein the substrate is a semiconductor and the further final oxidation step is a semiconductor oxidation process.

93. The composition of matter prepared by the method steps of claim 92, wherein the substrate is a semiconductor material selected from the group consisting of Si, $Si_xGe_{1-x}$, GaAs, $Si_{1-x-y}Ge_xC_y$, $Si_{3(1-x)}Ge_{3x}N_{4(1-\delta)}$, Ge, $Ga_{1-x}Al_xAs$, $Si_xGe_{(1-x)}(O_yN_{1-y})_n$, $Si_{1-x-y}Ge_xC_y(O_zN_{1-z})_n$ and $(Si_{1-x-y}Ge_xC_y)_3N_{4-x-y}$.

94. The method of claim 11, wherein said etchant is HF:methanol (1:9).

95. The method of claim 11, wherein said substrate is Si(100).

96. The semiconductor device of claim 43, wherein the substrate is the semiconductor material Si(100).

97. A method of producing a planar dielectric layer on a planar semiconductor substrate comprising:
   a) providing a crystalline semiconductor substrate having a polished surface;
   b) after step (a), degreasing the surface with a degreasing agent that is oxidizing and strongly basic to remove contaminants from the surface including organic impurities;
   c) after step (b), etching the surface with an acid solution to remove native oxide and ionized impurities imbedded in native oxide on the surface or located on the surface;
   d) after step (c), re-oxidizing the surface with an oxidizing agent to create a chemically grown oxide layer on the surface and to trap in the oxide layer any impurity left on the surface; and
   e) after step (d), using a solvent and an etchant in solution, passivating the surface to remove the oxide of step (d) and to grow a long-range ordered passivation layer on the surface.

98. The method according to claim 97, wherein step (a) comprises providing a crystalline semiconductor wafer.

99. The method according to claim 98, wherein the etchant of step (e) comprises HF, and the passivation layer grown is comprised of oxygen and hydrogen.

100. The method according to claim 99, wherein the passivation layer grown in step (e) is less than five monolayers of oxygen and hydrogen atoms ordered to conform to an ordered atomic crystal structure of the semiconductor at said surface.

101. The method according to claim 100, wherein the semiconductor is silicon.

102. The method according to claim 101, wherein the silicon is Si(100).

103. The method according to claim 97, further comprising the steps of rinsing the surface after each of steps (b), (c), (d) and (e).

104. The method according to claim 103, wherein the step of rinsing after step (e) comprises rinsing in methanol.

105. The method according to claim 97, further comprising:
   f) growing an ordered oxide layer on the surface on top of the passivating layer.

106. The method according to claim 97, wherein the oxidizing agent of step (d) comprises $H_2O$, $H_2O_2$ and HCl.

107. The method according to claim 102, further comprising growing a layer of ordered $SiO_2$ on the surface on top of the passivation layer.

108. The method according to claim 102, wherein the passivation layer of step (e) is comprised of oxygen and hydrogen.

109. The method according to claim 108, wherein the passivation layer grown in step (e) is less than five monolayers of oxygen and hydrogen atoms ordered to conform to an ordered atomic crystal structure of the silicon at said surface.

* * * * *